(12) United States Patent
Ku

(10) Patent No.: US 9,013,931 B2
(45) Date of Patent: Apr. 21, 2015

(54) SEMICONDUCTOR MEMORY DEVICE AND METHOD FOR TESTING THE SAME

(71) Applicant: SK Hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 112 days.

(21) Appl. No.: 13/799,756

(22) Filed: Mar. 13, 2013

(65) Prior Publication Data

US 2014/0133247 A1    May 15, 2014

(30) Foreign Application Priority Data

Nov. 14, 2012    (KR) .................. 10-2012-0128958

(51) Int. Cl.
| | |
|---|---|
| *G11C 29/04* | (2006.01) |
| *G11C 29/40* | (2006.01) |
| *G11C 7/10* | (2006.01) |
| *G11C 29/44* | (2006.01) |

(52) U.S. Cl.
CPC ............. *G11C 29/40* (2013.01); *G11C 7/1051* (2013.01); *G11C 7/106* (2013.01); *G11C 29/44* (2013.01)

(58) Field of Classification Search
CPC .............................. G11C 7/106; G11C 7/1051
USPC ...................................................... 365/189.05
See application file for complete search history.

(56) References Cited

U.S. PATENT DOCUMENTS

| | | | | |
|---|---|---|---|---|
| 8,024,627 | B2 * | 9/2011 | Song ............................. | 714/718 |
| 8,248,874 | B2 * | 8/2012 | An ................................ | 365/201 |
| 2012/0173942 | A1 * | 7/2012 | Do et al. ...................... | 714/731 |

FOREIGN PATENT DOCUMENTS

KR     1020110108558     10/2011

* cited by examiner

*Primary Examiner* — Hoai V Ho
*Assistant Examiner* — Tri Hoang
(74) *Attorney, Agent, or Firm* — IP & T Group LLP

(57) ABSTRACT

A semiconductor memory device includes a compression unit configured to compress a plurality of data, which are read from a memory cell region based on successive read commands and addresses, and to successively output the compressed data during a first test mode, a latching unit configured to latch the compressed data in response to a read strobe signal and to fix the latched value when a fail is detected from the compressed data during the first test mode, and an output unit configured to output the latched value to the outside during a second test mode.

19 Claims, 3 Drawing Sheets

FIG. 4

| BG<1> | BG<0> | BA<1> | BA<0> | Normal | TDRM |
|---|---|---|---|---|---|
| 0 | 0 | 0 | 0 | BK0 | BK0/4/8/12 |
| 0 | 0 | 0 | 1 | BK1 | BK1/5/9/13 |
| 0 | 0 | 1 | 0 | BK2 | BK2/6/10/14 |
| 0 | 0 | 1 | 1 | BK3 | BK3/7/11/15 |
| 0 | 1 | 0 | 0 | BK4 | BK0/4/8/12 |
| 0 | 1 | 0 | 1 | BK5 | BK1/5/9/13 |
| 0 | 1 | 1 | 0 | BK6 | BK2/6/10/14 |
| 0 | 1 | 1 | 1 | BK7 | BK3/7/11/15 |
| 1 | 0 | 0 | 1 | BK8 | BK0/4/8/12 |
| 1 | 0 | 0 | 0 | BK9 | BK1/5/9/13 |
| 1 | 0 | 1 | 1 | BK10 | BK2/6/10/14 |
| 1 | 0 | 1 | 0 | BK11 | BK3/7/11/15 |
| 1 | 1 | 0 | 1 | BK12 | BK0/4/8/12 |
| 1 | 1 | 0 | 0 | BK13 | BK1/5/9/13 |
| 1 | 1 | 1 | 1 | BK14 | BK2/6/10/14 |
| 1 | 1 | 1 | 0 | BK15 | BK3/7/11/15 |

A (brace indicating first four rows)

SEMICONDUCTOR MEMORY DEVICE AND METHOD FOR TESTING THE SAME

CROSS-REFERENCE TO RELATED APPLICATIONS

The present application claims priority of Korean Patent Application No. 10-2012-0128958, filed on Nov. 14, 2012, which is incorporated herein by reference in its entirety.

BACKGROUND

1. Field

Exemplary embodiments of the present invention relate to a semiconductor design technology, and more particularly, to a semiconductor memory device and a method for testing the same.

2. Description of the Related Art

In general a semiconductor memory device such as Dynamic Random Access Memory (DRAM) supports a variety of test items, and a plurality of tests may be performed to secure reliability of the semiconductor memory device.

In the test technology for the semiconductor memory device with more than tens of millions of memory cells, a test time and a screening ability of the test may be main concerns. The test time reduction, in the development period and the mass-production level of the semiconductor memory device, may be directly related to a product fabrication cost. A parallel test (or compress test) is performed to reduce the test time for a plurality of memory cells.

The operation of the parallel test may be performed as follows. First, the same data are written into the plurality of memory cells, and exclusive OR (XOR) logics are then used to read the data from the plurality of memory cells. For example, when the same data are read from the plurality of memory cells, '1' is outputted to determine whether the semiconductor memory device is passed. On the other hand, when different data is read from any one of the plurality of memory cells, '0' is outputted to determine whether the semiconductor memory device is failed. That is, by the parallel test, a large unit of memory cells may be simultaneously screened Recently, the semiconductor memory device employs a grouped bank structure in which separate global input/output lines are provided for each bank group to improve performance. Therefore, the parallel test suitable for the grouped bank structure is in demand.

SUMMARY

Exemplary embodiments of the present invention are directed to a semiconductor memory device for providing a parallel test suitable for a grouped bank structure in which separate global input/output lines are provided for each bank group and a method for testing the same.

Other embodiments of the present invention are directed to a semiconductor memory device with the grouped bank structure for minimizing the test time during a parallel test and a method for testing the same.

In accordance with an embodiment of the present invention, a semiconductor memory device includes a compression unit configured to compress a plurality of data, which are read from a memory cell region based on successive read commands and addresses and to successively output the compressed data during a first test mode, a latching unit configured to latch the compressed data in response to a read strobe signal and to fix the latched value when a fail is detected from the compressed data during the first test mode, and an output unit configured to output the latched value to the outside during a second test mode.

In accordance with another embodiment of the present invention, a plurality of bank groups each having a plurality of banks, a plurality of data line groups provided to each of the plurality of bank groups, a selection unit configured to decode one or more bank group addresses and one or more bank addresses and to simultaneously select the banks corresponding to the respective bank groups during a first test mode, a compression unit configured to compress a plurality of data, which are read from the selected banks through the plurality of data line groups based on successive read commands, and to successively output the compressed data during the first test mode, a latching unit configured to latch the compressed data in response to a read strobe signal and to fix the latched value when a fail is detected from the compressed data during the first test mode, and an output unit configured to output the latched value to the outside during a second test mode.

In accordance with yet another embodiment of the present invention, a method for testing a semiconductor memory device, the method includes compressing a plurality of data loaded on the plurality of data, which are read from a memory cell region based on successive read commands and addresses, and successively generating compressed data during a first test mode, latching the compressed data in response to a read strobe signal, and outputting the latched value as the result of the first test mode to the outside during a second test mode. The latched value is fixed when a fail is detected from the latched compressed data.

BRIEF DESCRIPTION OF THE DRAWINGS

FIG. 4 is a state table for explaining a method for testing the semiconductor memory device in accordance with the embodiment of the present invention.

DETAILED DESCRIPTION

Figure 1:
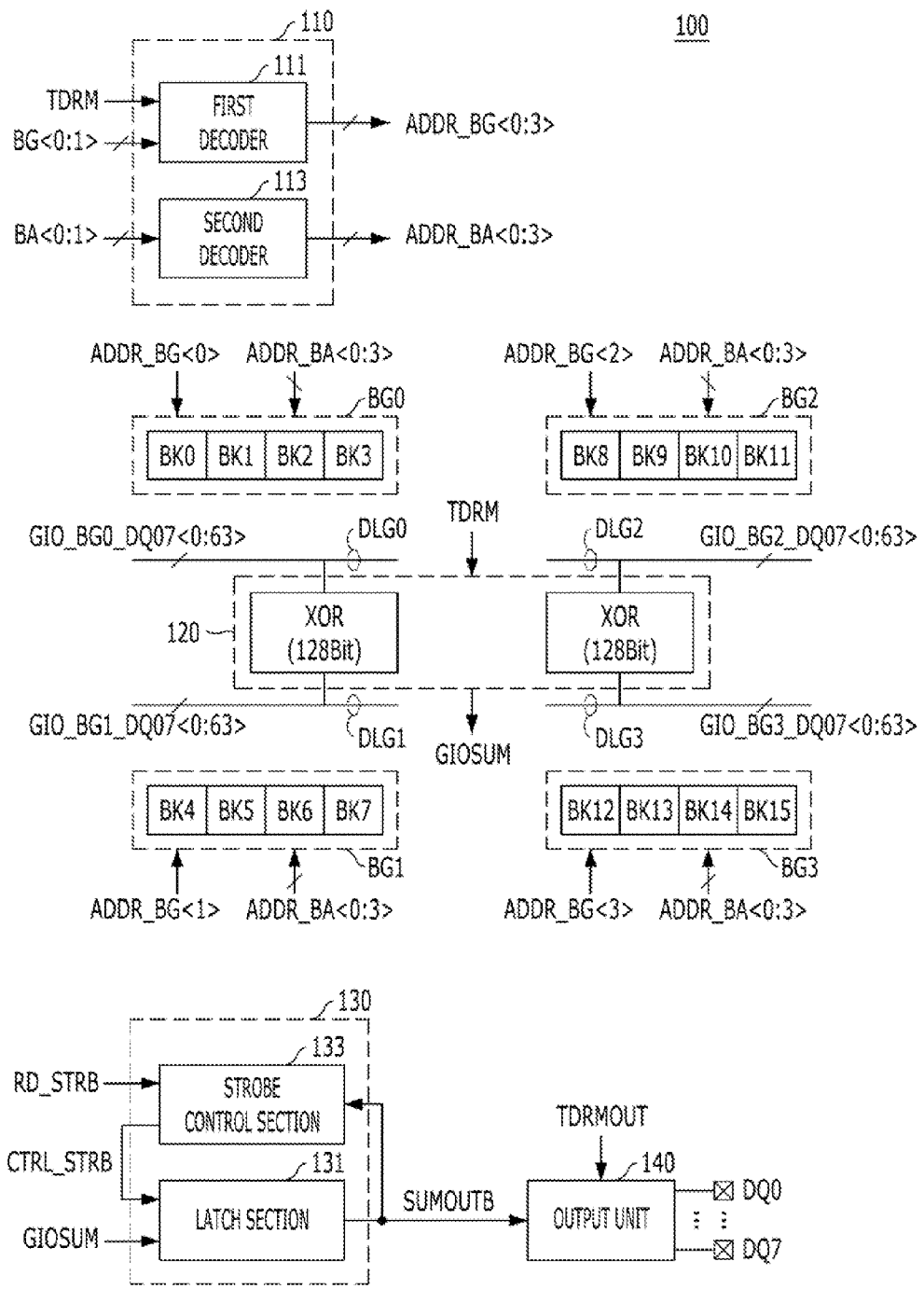
FIG. 1 is a block diagram illustrating a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

In this specification, 'connected/coupled' represents that one component is directly coupled to another component or indirectly coupled through another component. In addition a singular form may include a plural form as long as it is not specifically mentioned in a sentence.

In the embodiments of the present invention, a case in which a semiconductor memory device includes four bank groups and four banks for each bank group will be used as an example for the purpose of description.

FIG. 1 is a block diagram illustrating a semiconductor memory device in accordance with an embodiment of the present invention.

Referring to FIG. 1, the semiconductor memory device 100 includes first to fourth bank groups BG0 to BG3, first to fourth data line groups DLG0 to DLG3, a selection unit 110, a compression unit 120, a latching unit 130 and an output unit 140.

The first to fourth bank groups BG0 to BG3 include first to fourth banks BK0 to BK3, BK4 to BK7, BK8 to BK11, and BK12 to BK15, respectively. The first to fourth data line groups DLG0 to DLG3 include 64-bit data lines GIO_BG0_DQ07<0:63>, GIO_BG1_DQ07<0:63>, GIO_BG2_DQ07<0:63>, and GIO_BG3_DQ07<0:63>, respectively, and they are provided to correspond one-to-one to each of the first to fourth bank groups BG0 to BG3. The selection unit 110 is configured to sequentially select the first to fourth banks BK0 to BK3, BK4 to BK7, BK8 to BK11, and BK12 to BK15 of the respective bank groups BG0 to BG3 in response to first and second bank group addresses BG<0:1> and first and second bank addresses BA<0:1>, during a first test, mode. In this case, the banks BK0/4/8/12, BK1/5/9/13, BK2/6/10/14, and BK3/7/11/15 corresponding to the respective bank groups may be selected at the same time. The compression unit 120 is configured to successively compress a plurality of read data, which are successively transmitted for each bank through the plurality of data line groups DLG0 to DLG3, for each bank during the first test mode. The latching unit 130 is configured to latch the compressed data that are sequentially outputted in response to a strobe signal RD_STRB output the compressed data as a latched signal SUMOUTB, and fix the logic level of the latched signal SUMOUTB when a fail is detected from the compressed data (e.g., when the latched signal SUMOUTB is logic low level). The output unit 140 is configured to output the latched signal SUMOUTB to the outside during a second test mode.

Here, the first test mode refers to a parallel test mode, and is defined based on whether a first test signal TDRM is activated or not. The second test mode refers to a test mode for outputting a test result based on the parallel test mode to the outside at a desired time point, and is defined based on whether a second test signal TDRMOUT is activated or not. At this time, the activation period of the second test signal TDRMOUT may be overlapped or may not be overlapped with the activation period of the first test signal TDRM.

Meanwhile, each of the first to fourth data line groups DLG0 to DLG3 is shared by the first to fourth banks BK0 to BK3 BK4 to BK7, BK8 to BK11, or BK12 to BK15 of the corresponding bank group, respectively. That is, the 64-bit data lines GIO_BG0_DQ07<0:63> included in the first data line group DLG0 are commonly connected to the first to fourth banks BK0 to BK3 of the first bank group BG0, the 64-bit data lines GIO_BG1_DQ07<0:63> included in the second data line group DLG1 are commonly connected to the first to fourth banks BK4 to BK7 of the second bank group BG1, the 64-bit data lines GIO_BG2_DQ07<0:63> included in the third data line group DLG2 are commonly connected to the first to fourth banks BK8 to BK11 of the third bank group BG3, and the 64-bit data lines GIO_BG3_DQ07<0:63> included in the fourth data line group DLG3 are commonly connected to the first to fourth banks BK12 to BK15 of the fourth bank group BG3. Here, the 64-bit data lines GIO_BG0_DQ07<0:63>, GIO_BG1_DQ07<0:63>, GIO_BG2_DQ07<0:63>, and GIO_BG3_DQ07<0:63> may be global input/output lines to transfer read/write data between bank region and I/O interface region in the semiconductor memory device.

The selection unit 110 includes a first decoder 111 and a second decoder 113. The first decoder in is configured to decode the first and second bank group addresses BG<0:1> to generate first to fourth bank group select signals ADDR_BG<0:3>, and output each of the first to fourth bank group select signals ADDR_BG<0:3> to the respective bank groups BG0 to BG3. Furthermore, the first decoder 111 is configured to activate all of the first to fourth bank group select signals ADDR_BG<0:3> in response to the first test signal TDRM. The second decoder 113 is configured to decode the first and second bank addresses BA<0:1> to generate first to fourth bank select signal's ADDR_BA<0:3> and commonly output the first to fourth bank select signals ADDR_BA<0:3> to the respective bank groups BG0 to BG3.

The compression unit 120 includes XOR logics. The compression unit 120 is configured to compress read data loaded on the 64-bit data lines GIO_BG0_DQ07<0:63>, GIO_BG1_DQ07<0:63>, GIO_BG2_DQ07<0:63>, and GIO_BG3_DQ07<0:63> in response to the first test signal TDRM and outputs the compressed data GIOSUM. The compressed data GIOSUM may be a 1-bit signal.

The latching unit 130 includes a latch section 131 and a strobe control section 133. The latch section 131 is configured to latch and output the compression data GIOSUM as the latched signal SUMOUTB in response to a strobe control signal CTRL_STRB. The strobe control section 133 is configured to output the strobe control signal CTRL_STRB by limiting a toggling period of a read strobe signal RD_STRB based on the logic level of the latched signal SUMOUTB outputted from the latch section 131. The read strobe signal RD_STRB may be generated in response to successive read commands.

The output unit 140 may include a circuit configured to input and output data during a normal mode, and the pads DQ0 to DQ7 may include data pads connected to the circuit configured to input and output data during the normal mode.

Figure 2:
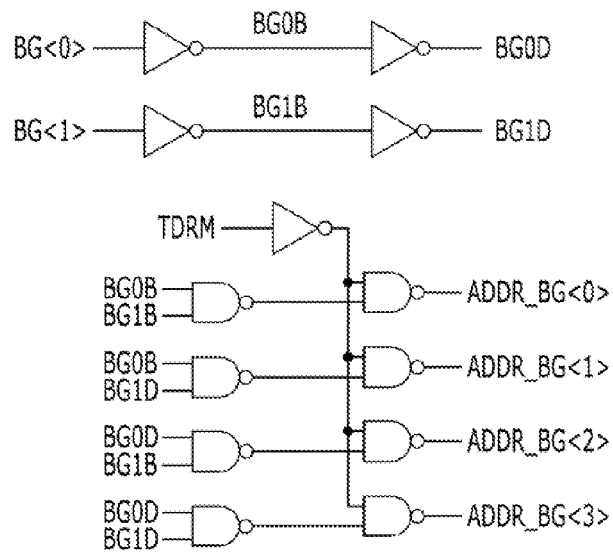
FIG. 2 is a detailed diagram illustrating a first decoder shown in FIG. 1.

FIG. 2 is a detailed diagram illustrating the first decoder 111 shown in FIG. 1.

Referring to FIG. 2, the first decoder 111 includes a logic circuit configured to activate one of the first to fourth bank group select signals ADDR_BG<0:3> in response to the first and second bank group addresses and to activate all of the first to fourth bank group select signals ADDR_BG<0:3> in response to the first test signal TDRM.

Figure 3:
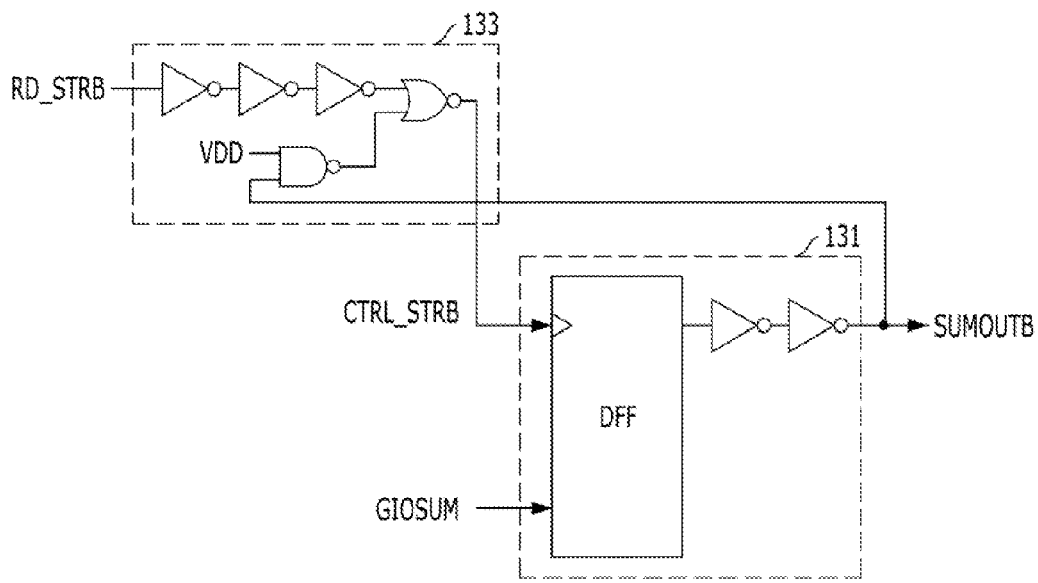
FIG. 3 is a detailed diagram illustrating a latching unit shown in FIG. 1.

FIG. 3 is a detailed diagram illustrating the latching unit 130 shown in FIG. 1.

Referring to FIG. 3, the latching unit 130 includes the latch section 131 and the strobe control section 133. The latch section 131 includes a latch configured to latch the current logic state of the compressed data GIOSUM at each predetermined edge of the strobe control signal CTRL_STRB. For example, the latch may include a D flip-flop. Furthermore, the strobe control section 133 includes a logic circuit configured to output the strobe control signal CTRL_STRB in response to the latched signal SUMOUTB, a power supply voltage VDD, and the read strobe signal RD_STRB.

Hereafter, a method for testing the semiconductor memory device 100 in accordance with the embodiment of the present invention will be described with reference to FIG. 4.

Referring to FIG. 4, during the normal mode, any one bank of any one bank group, that is, one of 16 banks BK0 to BK15 is selected to perform a write operation or read operation based on a combination of the first and second bank group addresses BG<0:1> and the first and second bank addresses BA<0:1>. On the other hand, during the parallel test mode in which the first test signal TDRM is activated, the first to fourth banks BK0 to BK3, BK4 to BK7, BK8 to BK11, and BK12 to BK15 are sequentially selected by combinations of the first and second bank addresses BA<0:1> regardless of the first and second bank group addresses BG<0:1>. At this time, the banks BK0/4/8/12, BK1/5/9/13, BK2/6/10/14, and BK3/7/11/15 corresponding to the respective bank groups are simultaneously selected to perform a write operation or read operation. This is because the first to fourth bank group select signals ADDR_BG<0:3> are simultaneously activated regardless of the first and second bank group address BG<0:1> during the parallel test mode. Therefore, when the write operation and the read operation are performed based on one-cycle combinations 'A' of the first and second bank addresses BA<0:1> regardless of the first and second bank group addresses BG<0:1>, the parallel test for all of the banks BK0 to BK15 included in all of the bank groups BG0 to BG3 is completed.

First, the write operation process during the parallel test mode is performed as follows. The write data transmitted through the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups are sequentially written into the first to fourth banks BK0 to BK3, BK4 to BK7, BK8 to BK11 and BK12 to BK15. In this case, the write data are simultaneously written into the banks BK0/4/8/12, BK1/5/9/13, BK2/6/10/14, and BK3/7/11/15 corresponding to the respective bank groups. For example, a plurality of first write data transmitted through the 64-bit data lines GIO_BG0_DQ07<0:63>, GIO_BG1_DQ07<0:63>, GIO_BG2_DQ07<0:63>, and GIO_BG3_DQ207<0:63> provided for the respective bank groups are simultaneously written into the first banks BK0/4/8/12 corresponding to the respective bank groups, a plurality of second write data transmitted through the 64-bit data lines GIO_BG0_DQ07<8:63>, GIO_BG1_DQ07<0:63>, GIO_BG2_DQ07<0:63>, and GIO_BG3_DQ07<0:63> provided for the respective bank groups are simultaneously written into the second banks BK1/5/9/13 corresponding to the respective bank groups, a plurality of third write data transmitted through the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups are simultaneously written into the third banks BK2/6/10/14 corresponding to the respective bank groups, and a plurality of fourth write data transmitted through the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups are simultaneously written into the fourth banks BK3/7/11/15 corresponding to the respective bank groups.

The read operation process during the parallel test mode is performed as follows. The banks BK0/4/8/12, BK1/5/9/13, BK2/6/10/14, and BK3/7/11/15 corresponding to the respective bank groups are simultaneously selected, and a plurality of read data read from the selected banks BK0/4/8/12, BK1/5/9/13, BK2/6/10/14, and BK3/7/11/15 are loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups, and the read data loaded on the 64-bit data lines GIO_BG0_DQ07<0:63>, GIO_BG1_DQ07<0:63>, GIO_BG2_DQ207<0:63> and GIO_BG3_DQ07<0:63> provided for the respective bank groups are compressed and latched. For example, the first banks BK0/4/8/12 corresponding to the respective bank groups are simultaneously selected, the plurality of first read data read from the selected first banks BK0/4/8/12 are loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups, and the plurality of first read data loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups are compressed and latched as the compressed data GIOSUM. Then, the second banks BK1/5/9/13 corresponding to the respective bank groups are simultaneously selected, the plurality of second read data read from the selected second banks BK1/5/9/13 are loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups, and the plurality of second read data loaded on the 64-bit data lines GIO_BG0 DQ07<0:63>, GIO_BG1_DQ07<0:63>, GIO_BG2_DQ07<0:63>, and GIO_BG3_DQ07<0:63> provided for the respective bank groups are compressed and latched as the compressed data GIOSUM. Then, the third banks BK2/6/10/14 corresponding to the respective bank groups are simultaneously selected, the plurality of third read data read from the selected third banks BK2/6/10/14 are loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups, and the plurality of third read data loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups are compressed and latched as the compressed data GIOSUM. Then, the fourth banks BK3/7/11/15 corresponding to the respective bank groups are simultaneously selected, the plurality of fourth read data read from the selected fourth banks BK3/7/11/15 are loaded on the 64-bit data lines GIO_BG0_DQ07<0:63>, GIO_BG1_DQ07<0:63>, GIO_BG2_DQ07<0:63>, and GIO_BG3_DQ07<0:63> provided for the respective bank groups, and the plurality of fourth read data loaded on the 64-bit data lines GIO_BG0 DQ07<0:63>, GIO_BG1_DQ07<0:63>, GIO_BG2_DQ07<0:63>, and GIO_BG3_DQ07<0:63> provided for the respective bank groups are compressed and latched as the compressed data GIOSUM.

Meanwhile, when the compressed data GIOSUM that are successively generated in response to the plurality of first to fourth read data are latched, the current compressed data GIOSUM is continuously updated instead of the previous compressed data GIOSUM. For example, the latch section 131 latches the first compressed data GIOSUM which is generated in correspondence to the plurality of first read data, as the latched signal SUMOUTB in response to the strobe control signal CTRL_STRB, latches the second compressed data GIOSUM, which is generated in correspondence to the plurality of second read data, as the latched signal SUMOUTB in response to the strobe control signal CTRL_STRB, latches the third compressed data GIOSUM, which is generated in correspondence to the plurality of third read data, as the latched signal SUMOUTB in response to the strobe control signal CTRL_STRB, and latches the fourth compressed data GIOSUM, which is generated in correspondence to the plurality of fourth read data, as the latched signal SUMOUTB in response to the strobe control signal CTRL_STRB.

At this time, when the latched signal SUMOUTB corresponds to a fail as the parallel test result, the strobe control section 133 blocks the read strobe signal RD_STRB, and outputs the strobe control signal CTRL_STRB at a fixed voltage levels. Then, the latch section 131 outputs and maintains the latched signal SUMOUTB corresponding to a fail, regardless of the following compressed data GIOSUM. For example, when the first compressed data GIOSUM is at a logic high level corresponding to a pass based on the parallel test result, the latch section 131 outputs and maintains the latched signal SUMOUTB at a logic high level corresponding to a pass, and the strobe control section 133 outputs the read strobe signal RD_STRB as the strobe control signal CTRL_STRB. When the second compressed data GIOSUM is at a logic low level corresponding to a fail based on the parallel test result, the latch section 131 outputs and maintains the latched signal SUMOUTB at a logic low level corresponding to a fail, and the strobe control section 133 blocks the read strobe signal RD_STRB and outputs the strobe control signal CTRL_STRB fixed to a logic low level. Accordingly, the latch section 133 outputs and maintains the latched signal SUMOUTB corresponding to a fail based on the strobe control signal CTRL_STRB fixed at a logic low level, regardless of the third and fourth compressed data GIOSUM.

Then, during a specific test mode, the latched signal SUMOUTB is outputted to the outside. The specific test mode is a test mode for outputting the parallel test result to the outside at a desired time point, and refers to a period in which the second test signal TDRMOUT is activated. Therefore, when only the latched signal SUMOUTB is monitored at a required time point after the parallel test mode is completed, it may be possible to check whether or not a fail occurred in the semiconductor memory device 100.

In accordance with the embodiments of the present invention, a plurality of bank groups may be simultaneously selected to perform the parallel test, thereby reducing the test time. Furthermore, since the process of outputting the latched signal SUMOUTB to the outside for each bank during the parallel test mode is omitted (the continuous latch method through update is adopted), the address access time tAA during the parallel test mode may be improved. Therefore, the test time may be further reduced.

Furthermore, the result of the parallel test may be monitored from the outside at a desired time point using a separate test mode that is different from the parallel test mode. Therefore, failure information of the semiconductor may be easily checked, and the failure information may be used as screening information.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a compression unit configured to compress a plurality of data, which are read from a memory cell region based on successive read commands and addresses, and to successively output the compressed data during a first test mode;
   a latching unit configured to latch the compressed data in response to a read strobe signal and to fix the latched value when a fail is detected from the compressed data during the first test mode; and
   an output unit configured to output the latched value to the outside during a second test mode,
   wherein the latching unit comprises:
      a strobe control section configured to generate a strobe control signal by limiting a toggling period of the read strobe signal based on the compressed data, and
      wherein the strobe control section blocks the read strobe signal when the strobe control signal is logic low level.

2. The semiconductor memory device of claim 1, wherein the read strobe signal generated in response to the successive read commands.

3. The semiconductor memory device of claim 1, wherein the latching unit further comprises:
   a latch section configured to latch the compressed data in response to the strobe control signal.

4. The semiconductor memory device of claim 1, wherein the memory cell region includes a grouped bank structure.

5. The semiconductor memory device of claim 1, wherein the output unit includes one or more output pads.

6. The semiconductor memory device of claim 3, wherein the latch section includes a D flip-flop configured to latch the compressed data at each predetermined edge of the strobe control signal.

7. The semiconductor memory device of claim 5, wherein the output unit is configured to output read data through the one or more output pads during a normal mode.

8. A semiconductor memory device comprising:
   a plurality of bank groups each having a plurality of banks;
   a plurality of data line groups provided to each of the plurality of bank groups;
   a selection unit configured to decode one or more bank group addresses and one or more bank addresses and to simultaneously select the banks corresponding to the respective bank groups during a first test mode;
   a compression unit configured to compress a plurality of data, which are read from the selected banks through the plurality of data line groups based on successive read commands in response to a first test signal, and to successively output the compressed data during the first test mode;
   a latching unit configured to latch the compressed data in response to a read strobe signal, generate the compressed data as a latched signal and to fix a logic level of the latched signal when a fail is detected from the compressed data, during the first test mode; and
   an output unit configured to output the latched signal to the outside during a second test mode,
   wherein the latching unit comprises:
      a strobe control section configured to generate a strobe control signal by limiting a toggling period of the read strobe signal based on the compressed data, and
      wherein the strobe control section blocks the read strobe signal when the strobe control signal is logic low level.

9. The semiconductor memory device of claim 8, wherein each of the plurality of data line groups includes global input/output lines.

10. The semiconductor memory device of claim 8, wherein the selection unit comprises:
    a first decoder configured to decode the bank group addresses to generate a plurality of bank group select signals and to output each of the plurality of bank group select signals to the respective bank groups; and
    a second decoder configured to decode the bank addresses to generate a plurality of bank select signals and to output the plurality of bank select signals to the plurality of bank groups.

11. The semiconductor memory device of claim 10, wherein the first decoder is configured to activate all of the bank group select signals during the first test mode.

12. The semiconductor memory device of claim 8, wherein the read strobe signal generated in response to the successive read commands.

13. The semiconductor memory device of claim 8, wherein the latching unit comprises:

a latch section configured to latch the compressed data in response to the strobe control signal.

14. The semiconductor memory device of claim 8, wherein the output unit includes one or more output pads.

15. The semiconductor memory device of claim 13, wherein the latch section includes a D flip-flop configured to latch the compressed data at each predetermined edge of the strobe control signal.

16. The semiconductor memory device of claim 14, wherein the output unit is configured to output read data through the one or more output pads during a normal mode.

17. A method for testing a semiconductor memory device, the method comprising:
compressing a plurality of data loaded on the plurality of data, which are read from a memory cell region based on successive read commands and addresses, and successively generating compressed data during a first test mode;
latching the compressed data in response to a read strobe signal, generating the compressed data as a latched signal; and
outputting the latched value as the result of the first test mode to the outside during a second test mode,
wherein a logic level of the latched value is fixed when a fail is detected from the latched compressed data during the first test mode,
wherein the latching of the compressed data including:
generating a strobe control signal by limiting a toggling period of the read strobe signal based on the compressed data, and
wherein the strobe control section blocks the read strobe signal when the strobe control signal is logic low level.

18. The method of claim 17, wherein the read strobe signal generated in response to the successive read commands.

19. The method of claim 18, wherein the memory cell region includes a grouped bank structure.

* * * * *